(12) United States Patent
Kappus et al.

(10) Patent No.: US 9,941,841 B2
(45) Date of Patent: Apr. 10, 2018

(54) CLIPPING DISTORTION MITIGATION SYSTEMS AND METHODS

(71) Applicant: Turtle Beach Corporation, San Diego, CA (US)

(72) Inventors: Brian Alan Kappus, San Diego, CA (US); Victor Joseph Manzella, Jr., San Diego, CA (US); Gavin Alistair David Cutting, San Diego, CA (US)

(73) Assignee: Turtle Beach Corporation, San Diego, CA (US)

( * ) Notice: Subject to any disclaimer, the term of this patent is extended or adjusted under 35 U.S.C. 154(b) by 0 days.

(21) Appl. No.: 15/071,042

(22) Filed: Mar. 15, 2016

(65) Prior Publication Data
US 2017/0272034 A1    Sep. 21, 2017

(51) Int. Cl.
*H04B 15/00*  (2006.01)
*H03C 1/52*  (2006.01)
*H04R 3/04*  (2006.01)

(52) U.S. Cl.
CPC ............... *H03C 1/52* (2013.01); *H04R 3/04* (2013.01)

(58) Field of Classification Search
None
See application file for complete search history.

(56) References Cited

U.S. PATENT DOCUMENTS

| 4,156,116 A * | 5/1979 | Yanick | H03G 11/002 381/106 |
| 2011/0092173 A1* | 4/2011 | McCallister | H03F 1/3247 455/108 |
| 2015/0381782 A1* | 12/2015 | Park | H04M 9/08 381/100 |

* cited by examiner

*Primary Examiner* — Joseph Saunders, Jr.
*Assistant Examiner* — James Mooney
(74) *Attorney, Agent, or Firm* — Sheppard Mullin Richter & Hampton LLP; Daniel Yannuzzi; Hector Agdeppa (57) ABSTRACT

An audio system includes a processor including an input configured to: receive a baseband audio signal and modulate the baseband audio signal to create a modulated audio signal comprising audio signal frequency components in a first frequency range; clip the modulated audio signal to create a clipped, modulated audio signal the clipped modulated audio signal comprising the audio signal frequency components in the first range and further comprising distortion frequency components outside the first frequency range. The system can further be configured to filter the clipped, modulated audio signal to remove frequency components outside the first frequency to remove distortion components outside that frequency range.

31 Claims, 10 Drawing Sheets

CLIPPING DISTORTION MITIGATION SYSTEMS AND METHODS

TECHNICAL FIELD

The present disclosure relates generally to parametric audio. More particularly, some embodiments relate to systems and methods for clipping distortion mitigation for ultrasonic audio systems.

BACKGROUND OF THE INVENTION

Parametric sound is a fundamentally new class of audio, which relies on a non-linear mixing of an audio signal with an ultrasonic carrier. One of the key enablers for this technology is a high-amplitude, efficient ultrasonic source, which is referred to here as an emitter or transducer. Ultrasonic emitters can be created through a variety of different fundamental mechanisms, such as piezoelectric, electrostatic, and thermoacoustic, to name a few. Electrostatic emitters are generally capacitive devices consisting of two conductive faces with an air gap, where at least one of the conductive faces has a texture that is critical to the functionality of the emitter.

Non-linear transduction results from the introduction of sufficiently intense, audio-modulated ultrasonic signals into an air column. Self-demodulation, or down-conversion, occurs along the air column resulting in the production of an audible acoustic signal. This process occurs because of the known physical principle that when two sound waves with different frequencies are radiated simultaneously in the same medium, a modulated waveform including the sum and difference of the two frequencies is produced by the non-linear (parametric) interaction of the two sound waves. When the two original sound waves are ultrasonic waves and the difference between them is selected to be an audio frequency, an audible sound can be generated by the parametric interaction.

Parametric audio reproduction systems produce sound through the heterodyning of two acoustic signals in a non-linear process that occurs in a medium such as air. The acoustic signals are typically in the ultrasound frequency range. The non-linearity of the medium results in acoustic signals produced by the medium that are the sum and difference of the acoustic signals. Thus, two ultrasound signals that are separated in frequency can result in a difference tone that is within the 60 Hz to 20,000 Hz range of human hearing.

Like conventional audio systems, ultrasonic audio systems can suffer from distortion caused by the phenomenon known as clipping. Clipping is a form of waveform distortion that cuts off the peaks and troughs of the audio waveform when the signal is driven beyond the capacity of the amplifier. Clipping occurs when an audio signal exceeds a maximum value allowed by the audio system. The signal beyond the capability of the system is cut off, or clipped, resulting in distortion of the audio signal and the creation of nonlinear distortion products, such as unwanted harmonics related to the input.

Figure 1:
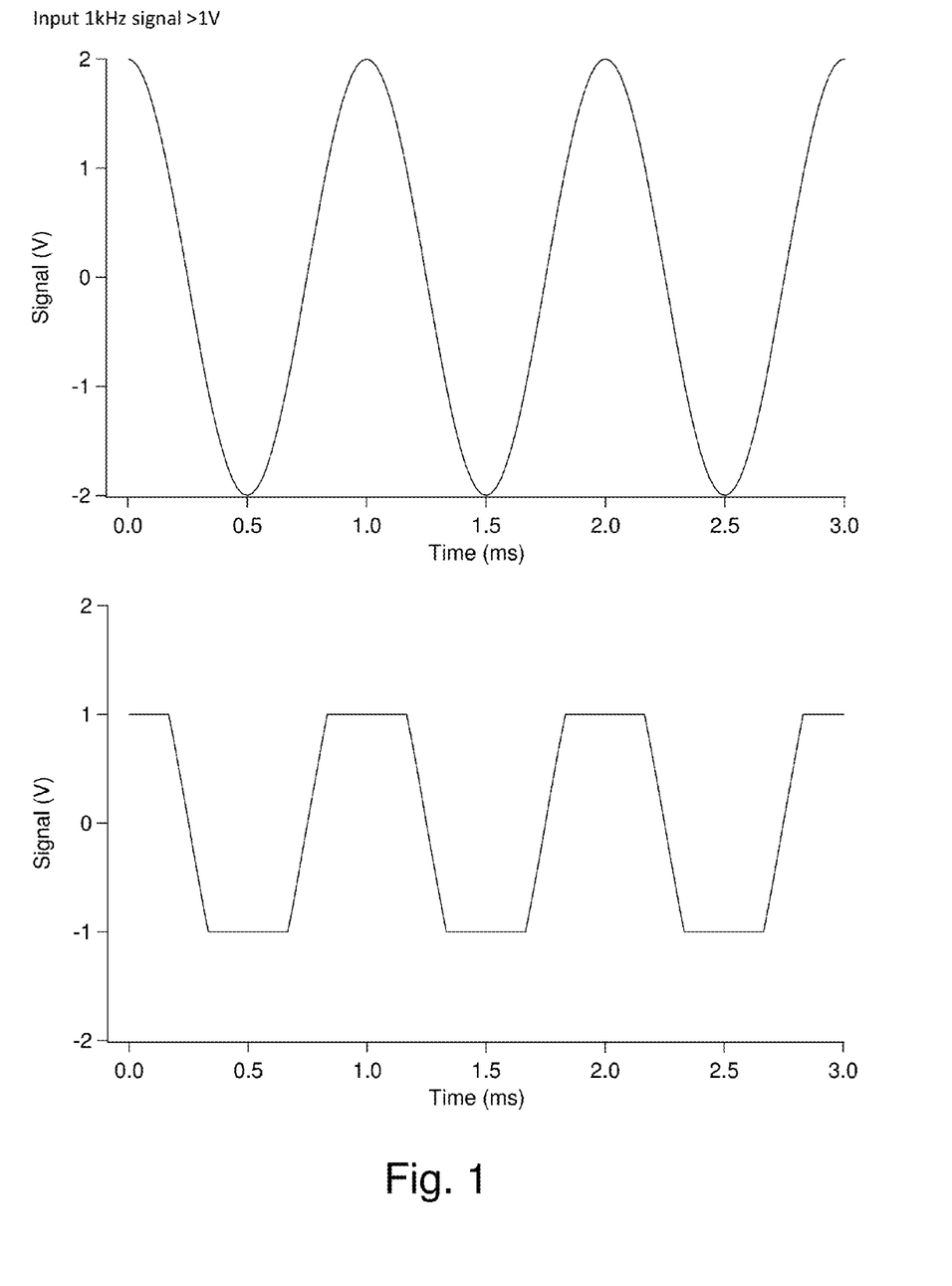
FIG. 1 is a diagram illustrating an example of clipping of a tone signal.

Digital signal processing (DSP) has been applied extensively to audio, including to perform functions such as compression, equalization, surround sound, pitch control, etc. Many of these algorithms can apply gain to an input signal and the resulting output can exceed the maximum signal level allowed by digital to analog conversion after processing. The resulting signal is 'clipped' whereby any signal attempting to exceed the maximum value is reduced, or clipped at the maximum value. Similarly, there is a minimum value whereby signals below this value are raised. To illustrate this, consider a system having its output limited to a range between −1 to 1 volts. Any value below −1 is raised to −1, and any value above 1 is dropped to 1. An example of this clipping is shown in FIG. 1. As seen in this example, an 1 kHZ input tone with an amplitude of 2 volts peak-to-peak (top of Figure) is clipped at +/−1 volt (bottom of Figure).

Figure 2:
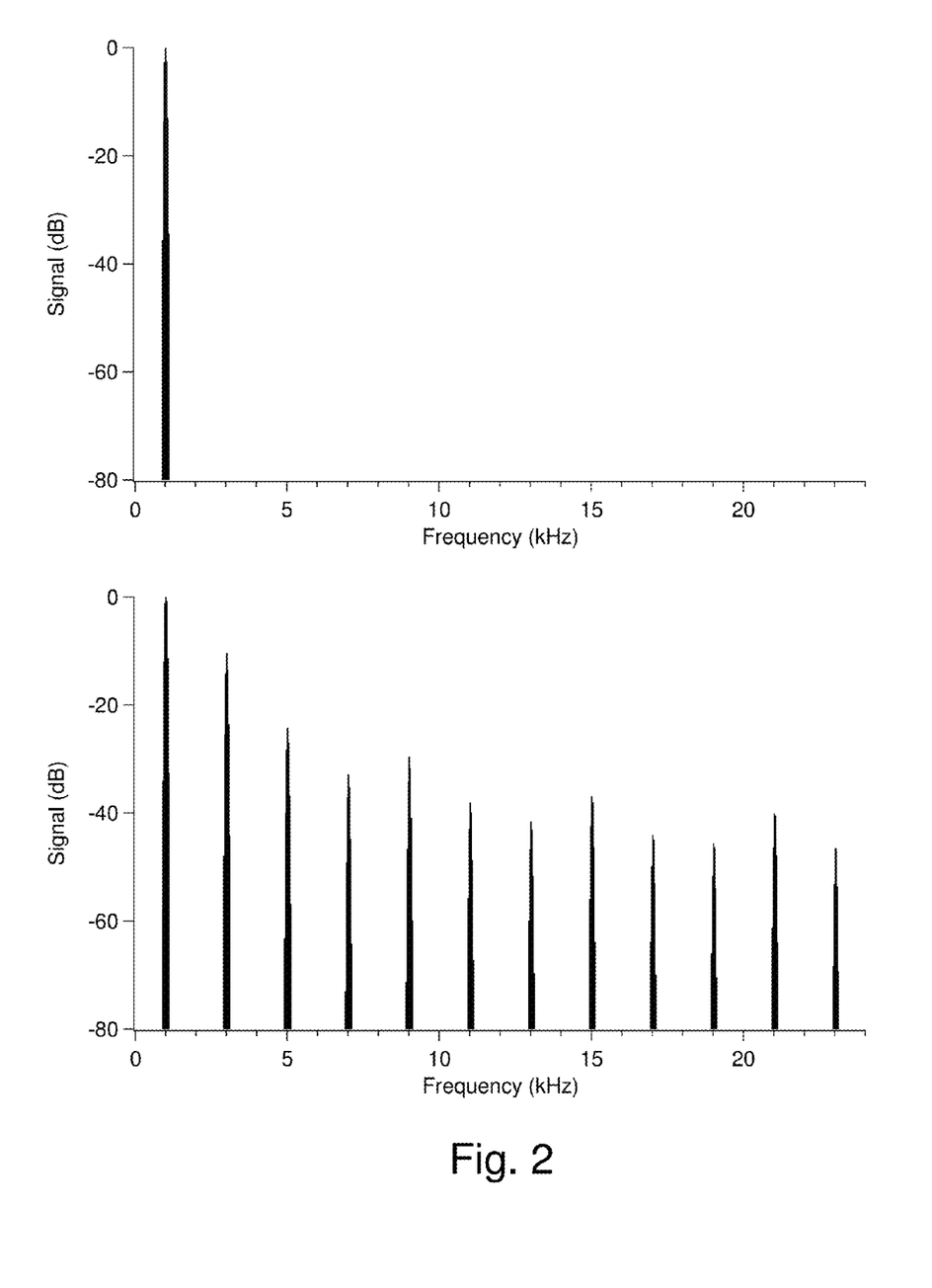
FIG. 2 is a diagram showing the frequency components of the original and clipped signals of FIG. 1.

The resulting spectrum is shown in FIG. 2. Before clipping the spectrum is a pure tone with one frequency component (top of Figure). After clipping, odd ($3^{rd}$, $5^{th}$, $7^{th}$, etc.) appear and significantly color the audio experienced (bottom of Figure).

SUMMARY

Embodiments of the technology described herein include systems and methods for reducing distortion caused by clipping in an audio system. In various embodiments, single-sideband modulation is used and clipping is performed after modulation. Distortion components introduced as a result of the clipping can be removed using a bandpass, or a high-pass or low-pass filter to filter out distortion components outside of the frequency range of the single-sideband modulated signal. Filtering can be performed in the analog or digital domain.

A digital system can mitigate the distortion products by first modulating the signal using single sideband modulation before clipping. When the system clips at the higher, modulated frequency, the clipping distortion is spread into a broader frequency range and large portion of it can be filtered and removed. The resulting filtered signal contains fewer distortion products than the traditional clipped signal. This modulated, then filtered, signal can be used for generating ultrasonic audio (e.g., by adding an ultrasonic carrier to the signal, preferably after filtering), or it can be demodulated for use in baseband audio.

In one embodiment, an audio system for mitigating distortion caused by clipping, includes a processor configured to: receive a baseband audio signal and modulate the baseband audio signal to create a modulated audio signal comprising audio signal frequency components in a first frequency range; clip the modulated audio signal to create a clipped, modulated audio signal the clipped modulated audio signal comprising the audio signal frequency components in the first range and further comprising distortion frequency components outside the first frequency range. The processor may be further configured to filter the clipped, modulated audio signal to remove frequency components outside the first frequency range and create a filtered, clipped, modulated audio signal. The audio system can also include a digital-to-analog converter comprising an input coupled to receive the filtered, clipped, modulated audio signal from the processor and configured to create an analog audio signal; and an amplifier having an input coupled to receive the analog audio signal and configured to generate an amplified analog audio signal.

The processor may further be configured to add a carrier signal to the clipped, modulated audio signal. This may be added back in before or after filtering, but is preferably added in after filtering so that the filtering doesn't affect the carrier signal.

The audio system can further include an ultrasonic emitter coupled to the amplifier, wherein the amplified analog audio signal comprises an amplified ultrasonic audio signal and the ultrasonic emitter is configured to launch an ultrasonic pressure wave representing the amplified ultrasonic audio signal.

In embodiments implementing conventional audio, the processor may be configured to demodulate the audio signal to create a baseband clipped audio signal that can be played back through a conventional audio speaker coupled to the amplifier.

In some embodiments, the modulation of the baseband audio signal may be single sideband modulation and wherein the first frequency range is an upper sideband or lower sideband of the modulated audio signal.

The modulation of the baseband audio signal may be single-sideband modulation using a Hilbert transform and the first frequency range may be the upper sideband of the transformed audio signal. In such a system, filtering the clipped, modulated audio signal may include applying a high pass filter to the clipped, modulated audio signal to remove frequency components below the single-sideband modulation frequency.

In another embodiment, a method for mitigating distortion of an audio signal, includes: receiving a baseband audio signal and modulating the baseband audio signal to create a modulated audio signal comprising audio signal frequency components in a first frequency range; clipping the modulated audio signal to create a clipped, modulated audio signal the clipped modulated audio signal comprising the audio signal frequency components in the first range and further comprising distortion frequency components outside the first frequency range; and filtering the clipped, modulated audio signal to remove frequency components outside the first frequency range and create a filtered, clipped, modulated audio signal. The method may further include adding an ultrasonic carrier to the clipped, modulated audio signal to create an ultrasonic audio signal. The ultrasonic carrier may be added before or after the step of filtering.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the accompanying figures. The drawings are provided for purposes of illustration only and merely depict typical or example embodiments of the invention. These drawings are provided to facilitate the reader's understanding of the systems and methods described herein, and shall not be considered limiting of the breadth, scope, or applicability of the claimed invention.

The figures are not intended to be exhaustive or to limit the invention to the precise form disclosed. It should be understood that the invention can be practiced with modification and alteration, and that the invention be limited only by the claims and the equivalents thereof.

DESCRIPTION

Embodiments of the systems and methods described herein provide an electrostatic ultrasonic audio system for various applications. In some embodiments, a digital audio system can be configured to mitigate distortion products caused by clipping by first modulating the signal using single sideband modulation, and then by limiting the signal after modulating the signal to a higher frequency above baseband audio. When the system clips at this higher frequency, the clipping distortion is spread into a broader frequency range and large portion of the resultant harmonics can be filtered and removed. Accordingly, the resulting signal contains fewer distortion products than the traditional clipped signal. This modulated, then filtered, signal can be used for generating ultrasonic audio or can be demodulated internally for use in baseband audio.

Figure 3:
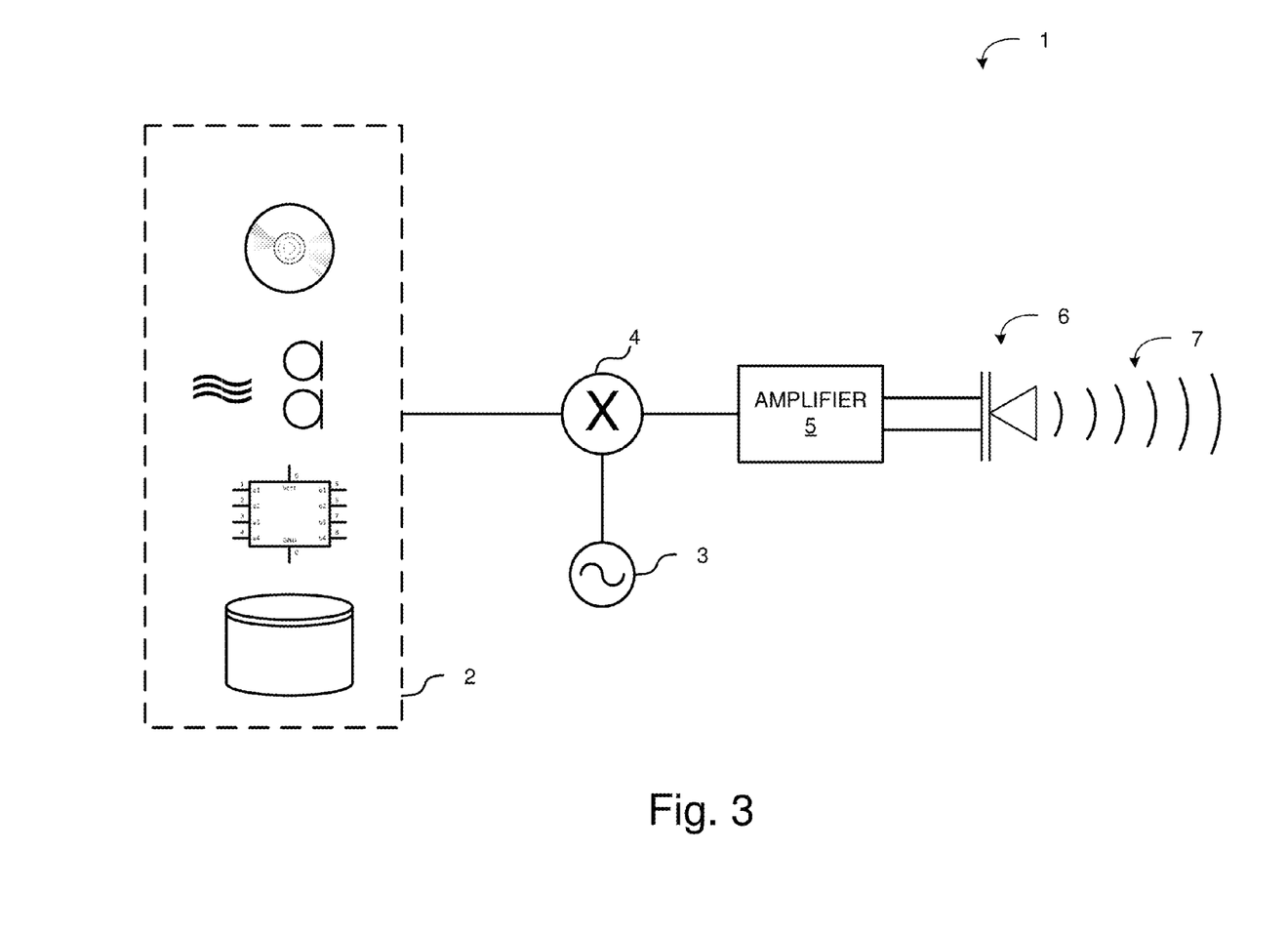
FIG. 3 is a diagram illustrating an ultrasonic sound system suitable for use with the emitter technology described herein.

Before describing these techniques in greater detail, it is useful to describe an example ultrasonic audio system with which the transducer can be implemented. FIG. 3 is a diagram illustrating an example ultrasonic sound system suitable for use with the systems and methods described herein. In this exemplary ultrasonic audio system 1, audio content from an audio source 2, such as, for example, a microphone, memory, a data storage device, streaming media source, CD player, DVD player, content display device, or other audio source is received. The audio content may be decoded and converted from digital to analog form, depending on the source. The audio content received by the audio system 1 is modulated onto an ultrasonic carrier of frequency f1, using a modulator. The modulator typically includes a local oscillator 3 to generate the ultrasonic carrier signal, and multiplier 4 to multiply the audio signal by the carrier signal. The resultant signal is a double- or single-sideband signal with a carrier at frequency f1. In some embodiments, signal is a parametric ultrasonic wave or an HSS signal. In most cases, the modulation scheme used is amplitude modulation, or AM. AM can be achieved by multiplying the ultrasonic carrier by the information-carrying signal, which in this case is the audio signal. The spectrum of the modulated signal has two sidebands, an upper and a lower side band, which are generally symmetric with respect to the carrier frequency, and the carrier itself.

The modulated ultrasonic signal is provided to the ultrasonic emitter or transducer 6, which launches the ultrasonic wave into the air creating ultrasonic wave 7. As noted above, in various embodiments the transducer 6 can be implemented as an electrostatic ultrasonic transducer such as in accordance with the examples described herein.

When played back through the transducer at a sufficiently high sound pressure level, due to nonlinear behavior of the air through which it is 'played' or transmitted, the carrier in the signal mixes with the sideband(s) to demodulate the signal and reproduce the audio content. This is sometimes referred to as self-demodulation. Thus, even for single-sideband implementations, the carrier is included with the launched signal so that self-demodulation can take place. Although the system illustrated in FIG. 3 uses a single transducer to launch a single channel of audio content, one of ordinary skill in the art after reading this description will understand how multiple mixers, amplifiers and transducers can be used to transmit multiple channels of audio using ultrasonic carriers.

Figure 4:
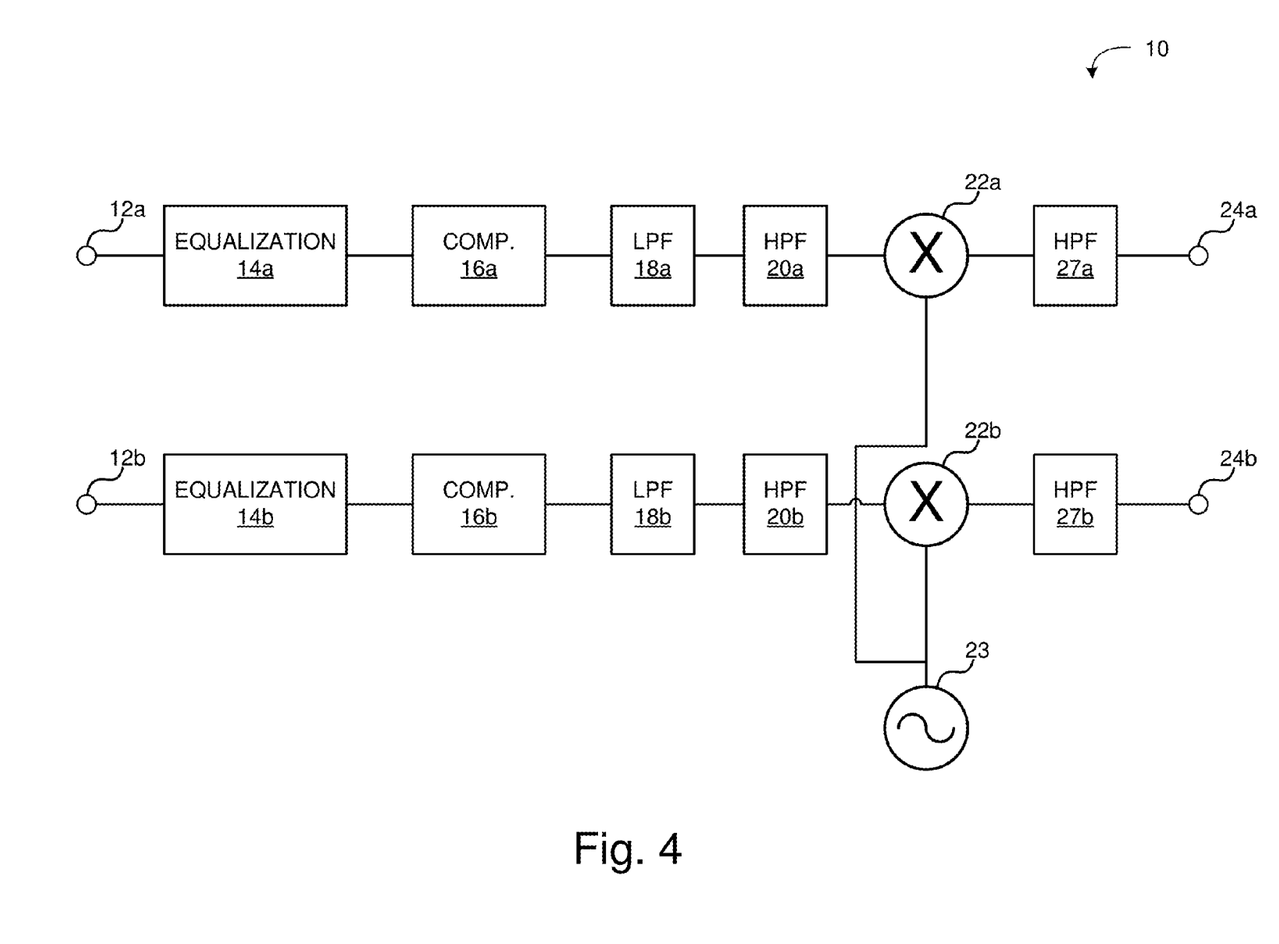
FIG. 4 is a diagram illustrating another example of a signal processing system that is suitable for use with the emitter technology described herein.

One example of a signal processing system 10 that is suitable for use with the technology described herein is illustrated schematically in FIG. 4. In this embodiment, various processing circuits or components are illustrated in the order (relative to the processing path of the signal) in which they are arranged according to one implementation. It is to be understood that the components of the processing circuit can vary, as can the order in which the input signal is processed by each circuit or component. Also, depending upon the embodiment, the signal processing system 10 can include more or fewer components or circuits than those shown.

The example shown in FIG. 3 is optimized for use in processing two input and output channels (e.g., a "stereo" signal), with various components or circuits including substantially matching components for each channel of the signal. It will be understood by one of ordinary skill in the art after reading this description that the audio system 1 can be implemented using a single channel (e.g., a "monaural" or "mono" signal), two channels (e.g., "stereo") (as illustrated in FIG. 4), or a greater number of channels.

Referring now to FIG. 4, the example signal processing system 10 can include audio inputs that can correspond to left 12a and right 12b channels of an audio input signal. Equalizing networks 14a, 14b can be included to provide equalization of the signal. The equalization networks can, for example, boost or suppress predetermined frequencies or frequency ranges to increase the benefit provided naturally by the emitter/inductor combination of the parametric emitter assembly.

After the audio signals are equalized, compressor circuits 16a, 16b can be included to compress the dynamic range of the incoming signal, effectively raising the amplitude of certain portions of the incoming signals and lowering the amplitude of certain other portions of the incoming signals. More particularly, compressor circuits 16a, 16b can be included to narrow the range of audio amplitudes. In one aspect, the compressors lessen the peak-to-peak amplitude of the input signals by a ratio of not less than about 2:1. Adjusting the input signals to a narrower range of amplitude can be done to minimize distortion, which is characteristic of the limited dynamic range of this class of modulation systems. In other embodiments, the equalizing networks 14a, 14b can be provided after compressor circuits 16a, 16b, to equalize the signals after compression.

Low pass filter circuits 18a, 18b can be included to provide a cutoff of high portions of the signal, and high pass filter circuits 20a, 20b providing a cutoff of low portions of the audio signals. In one exemplary embodiment, low pass filter circuits 18a, 18b are used to cut signals higher than about 15-20 kHz, and high pass filter circuits 20a, 20b are used to cut signals lower than about 20-200 Hz.

The high pass filter circuits 20a, 20b can be configured to eliminate low frequencies that, after modulation, would result in deviation of carrier frequency (e.g., those portions of the modulated signal that are closest to the carrier frequency). Also, some low frequencies are difficult for the system to reproduce efficiently and as a result, much energy can be wasted trying to reproduce these frequencies. Therefore, high pass filter circuits 20a, 20b can be configured to cut out these frequencies.

Low pass filter circuits 18a, 18b can be configured to eliminate higher frequencies that, after modulation, could result in the creation of an audible beat signal with the carrier. By way of example, if a low pass filter cuts frequencies above 15 kHz, and the carrier frequency is approximately 44 kHz, the difference signal will not be lower than around 29 kHz, which is still outside of the audible range for humans. However, if frequencies as high as 25 kHz were allowed to pass the filter circuit, the difference signal generated could be in the range of 19 kHz, which is within the range of human hearing.

In the example signal processing system 10, after passing through the low pass and high pass filters, the audio signals are modulated by modulators 22a, 22b. Modulators 22a, 22b, mix or combine the audio signals with a carrier signal generated by oscillator 23. For example, in some embodiments a single oscillator (which in one embodiment is driven at a selected frequency of 40 kHz to 100 kHz (or higher), which range corresponds to readily available crystals that can be used in the oscillator) is used to drive both modulators 22a, 22b. By utilizing a single oscillator for multiple modulators, an identical carrier frequency is provided to multiple channels being output at 24a, 24b from the modulators. Using the same carrier frequency for each channel lessens the risk that any audible beat frequencies may occur.

High-pass filters 27a, 27b can also be included after the modulation stage. High-pass filters 27a, 27b can be used to pass the modulated ultrasonic carrier signal and ensure that no audio frequencies enter the amplifier via outputs 24a, 24b. Accordingly, in some embodiments, high-pass filters 27a, 27b can be configured to filter out signals below about 25 kHz. Also, in various embodiments, error correction may be employed to reduce or cancel out distortion that may arise in transmission of the ultrasonic signal through the medium to the listener.

Having thus described an example environment with which the systems and methods described herein can be implemented, these techniques are now described. After reading this description, one of ordinary skill in the art will understand how to implement these techniques in other applications and with other processing systems. In various applications, single sideband modulation is applied to the audio signal. In some embodiments, single-sideband modulation can be implemented using a Hilbert transform. Single sideband modulation can use the Hilbert transform to shift an input signal up or down by a fixed frequency. For instance single-sideband modulation using the Hilbert transform can add 50 kHz to the input signal. This would shift 1 kHz to 51 kHz and 2 kHz to 52 kHz, and so on for the baseband audio signal.

Figure 5:
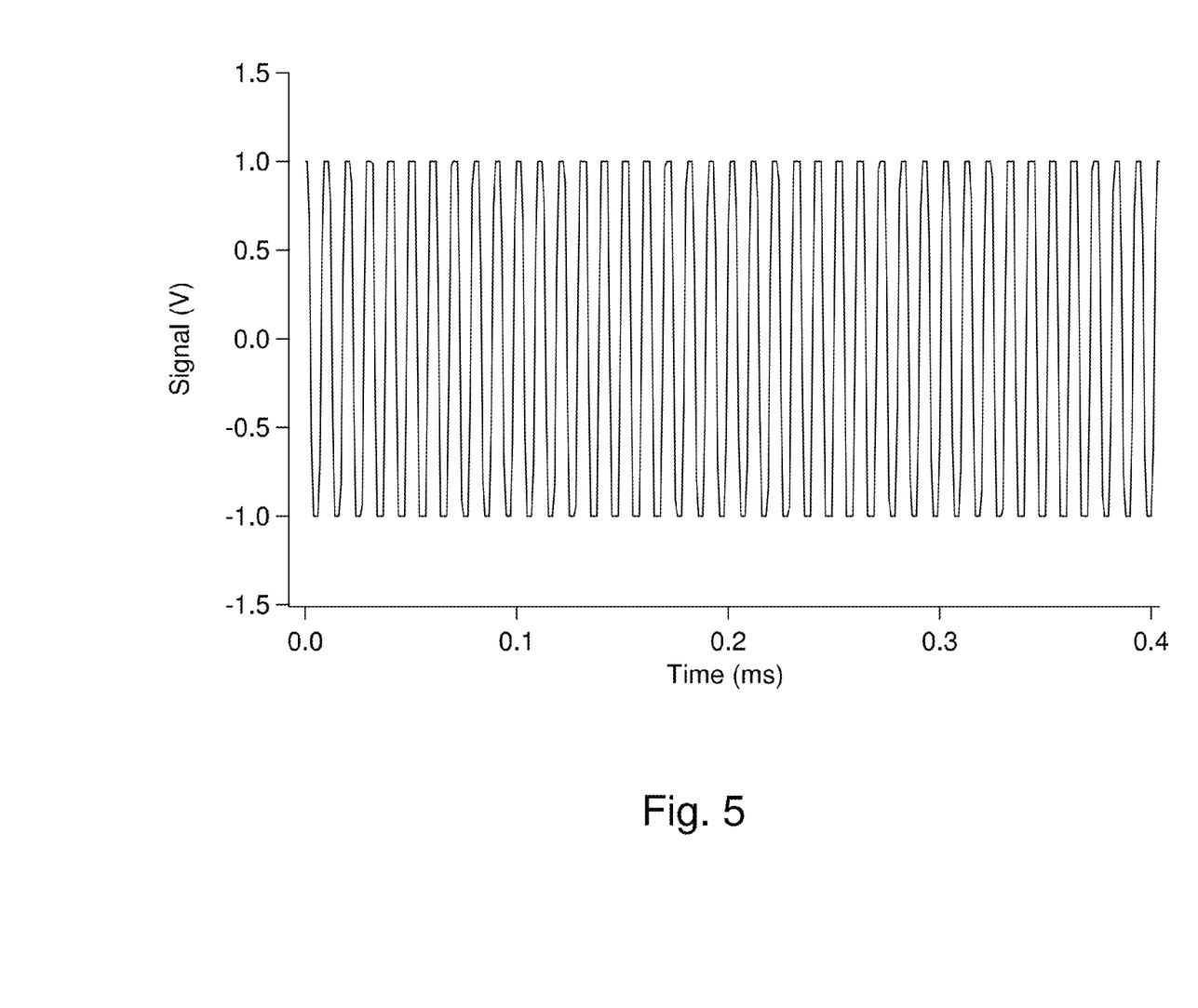
FIG. 5 is a diagram illustrating an example 1 kHZ basedband tone modulated at 100 kHZ and clipped after modulation.
Figure 6:
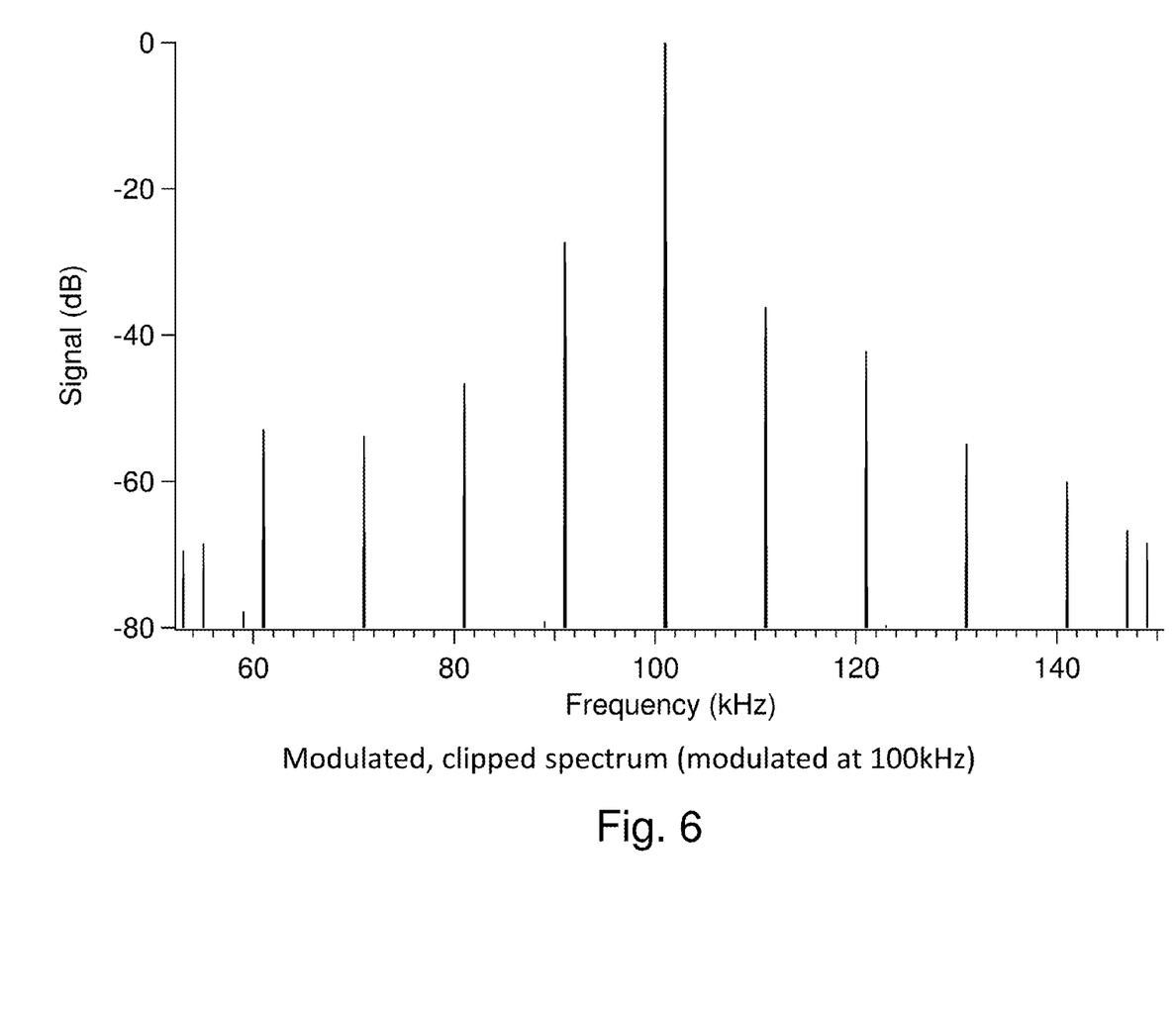
FIG. 6 is a diagram illustrating an example of a modulated, clipped spectrum for the signal of FIG. 5.

In embodiments of the techniques disclosed herein, the signal is clipped after modulating to a frequency above baseband audio. An example of this is shown in FIGS. 5 and 6 for a 1 kHz tone. As seen in this example, before modulation all of the distortion products are above the signal. If clipping is done on the modulated signal, this spreads the distortion products to above and below the modulation frequency of 100 kHz as shown in FIG. 6. In the example of FIGS. 5 and 6, the first distortion product, which is normally at ±3 kHz is now located at −3 kHz or 97 kHz. In this case, the baseband signal is a 1 kHz tone.

The modulated signal is frequency shifted by 100 kHz which shifts the signal to 101 kHz. Note that the largest distortion product is below 100 kHz at 97 kHz. One advantage of this method for single-sideband modulation is that only distortion products are found below the modulation frequency. By the nature of single-sideband modulation, the input signal is only above the modulation frequency. Now that signal and distortion are separated in frequency, the distortion can be filtered and removed. Utilizing a steep, high-pass filter at the modulation frequency effectively removes the lower sideband and therefore more than 50% of the distortion. This filtering can be implemented in the digital domain for digital applications (e.g., where the modulation is performed digitally such as by a DSP or other processor), or it may be implemented in the analog domain (e.g., after a digital-to-analog conversion) before the signal is sent to the emitter. In the analog domain, filtering can be performed after a digital-to-analog conversion either before or after the signal is amplified by the amplifier.

By filtering out the lower frequencies without addressing the higher frequencies, the resulting signal has preserved the original audio and greatly mitigated the distortion products created due to clipping. To apply the modulated, clipped signal for use in ultrasonic audio, a carrier signal at the modulation frequency is added. Alternatively, to use in baseband audio (such as for conventional audio) the signal can be demodulated using a Hilbert transform. An example of this is discussed in further detail below.

For ultrasonic audio, the ultrasonic emitter can be tailored to be optimized for the sideband at which the modulation occurs (e.g., upper sideband in the above example), and to be less efficient or otherwise produce a lower output at other frequencies. In other words, the ultrasonic emitter can be designed to operate as a low- or high-pass filter or as a bandpass filter to filter out the frequencies outside of the frequency range of the SSB modulated signal. According, the by spreading some of the distortion to the lower sideband as in the above example (or the upper sideband in other embodiments) distortion is reduced using this type of emitter. With sufficient affects by the emitter, a separate filter may not be needed to filter out the distortion components. While a separate filter may provide more pronounced effects, this approach may be more cost effective and require less computational complexity (or eliminate an analog filter if filtering is done in the analog domain).

Figure 7:
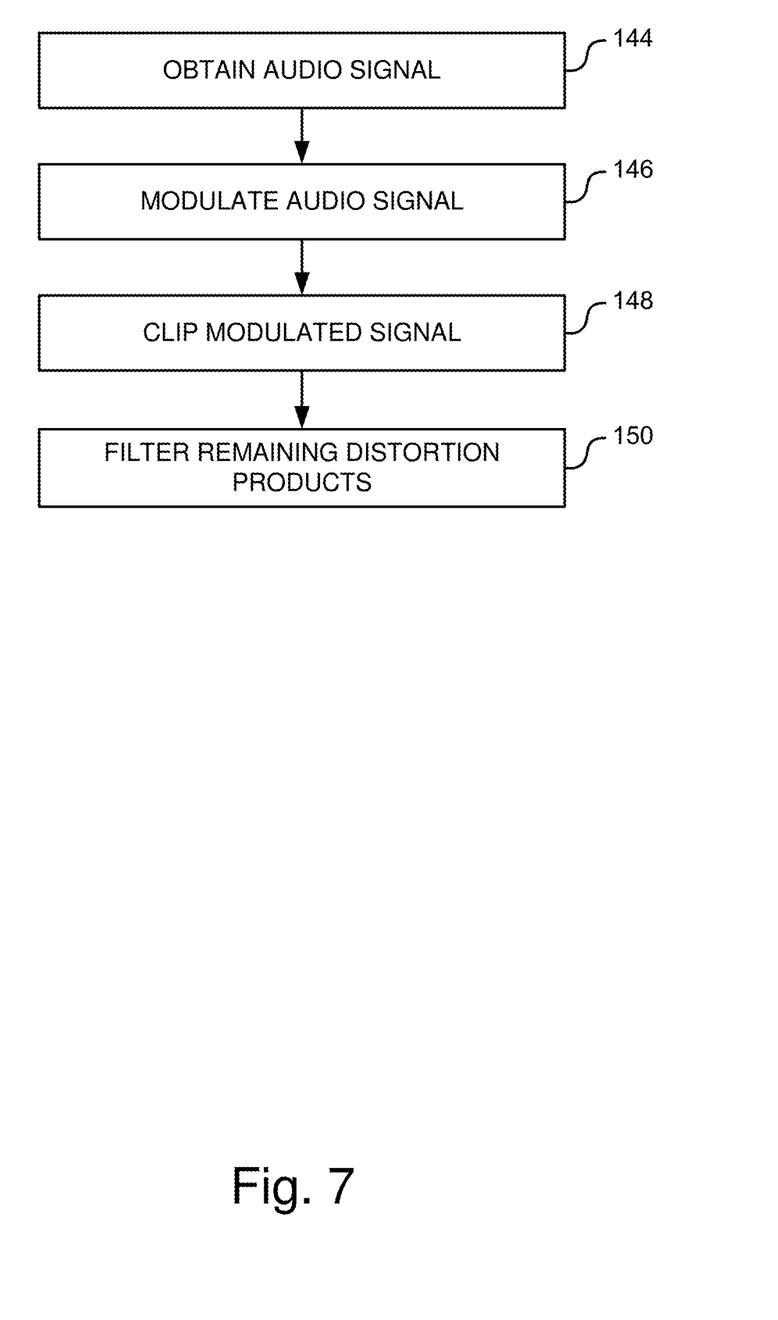
FIG. 7 is a diagram illustrating an example process for clipping after modulation in accordance with one embodiment of the technology described herein.

FIG. 7 illustrates an example process for modulated clipping in accordance with one embodiment of the systems and methods described herein. At operation 144 the system receives the baseband audio signal. For example, this can be analog or digital audio received from an audio source such as audio source 2 in FIG. 3. In the case of digital audio, the audio can be received by a processor such as a DSP or other processing device or circuit.

At operation 146 the audio signal is modulated to a higher frequency. Although some clipping can be applied prior to modulation, in various embodiments, no clipping is applied prior to modulation. Various forms of modulation can be applied, including single- or double-sideband modulation. As noted above, in other embodiments modulation is accomplished by applying a Hilbert transform to transform the baseband audio signal to a higher frequency.

At operation 148, the modulated signal is clipped to a predetermined level to avoid overdriving the amplifier or other components. Clipping typically results in unwanted frequency components, such as harmonics. At operation 150, the unwanted frequency components are filtered out of the signal.

Although not illustrated, for ultrasonic audio applications, an ultrasonic carrier, not generated by single-sideband modulation itself, can be added into the clipped signal to generate an ultrasonic audio signal. This can be done before or after the filtering operation. However, filtering before the carrier is added avoids the filter impacting the carrier signal itself.

In the example shown in FIGS. 5 and 6, with single-sideband modulation, the input signal is only above the modulation frequency. As a result, the signal and distortion are separated in frequency. This makes it easier to filter and remove the distortion. Accordingly, in one embodiment (e.g., USB embodiment) a high-pass filter is applied with a cutoff at the modulation frequency to remove the lower sideband and therefore more than 50% of the distortion.

Figure 8:
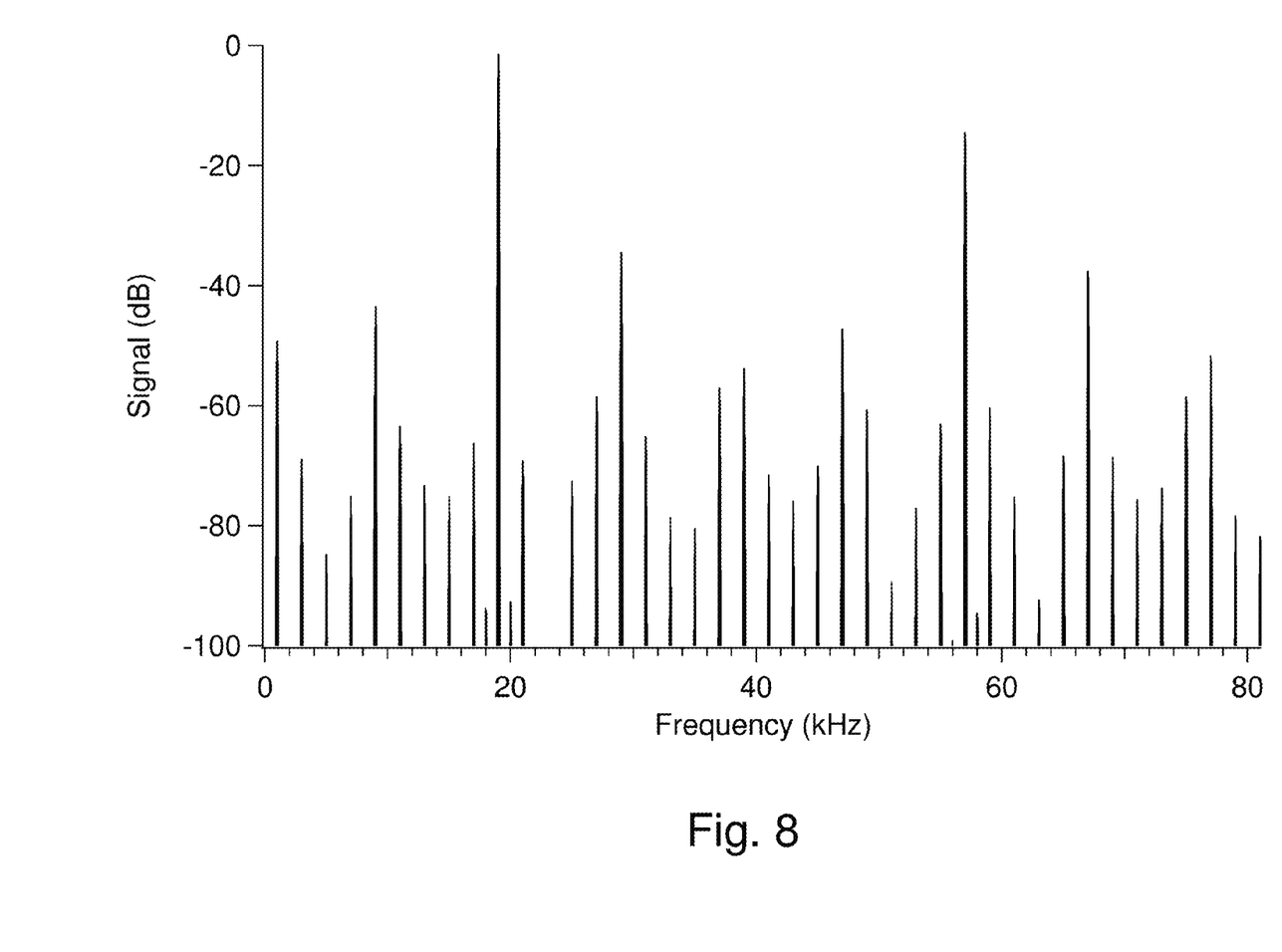
FIGS. 8-10 show an example sequence of modulation, filtering, and demodulation, along with the resulting spectrum for baseband audio reproduction.
Figure 9:
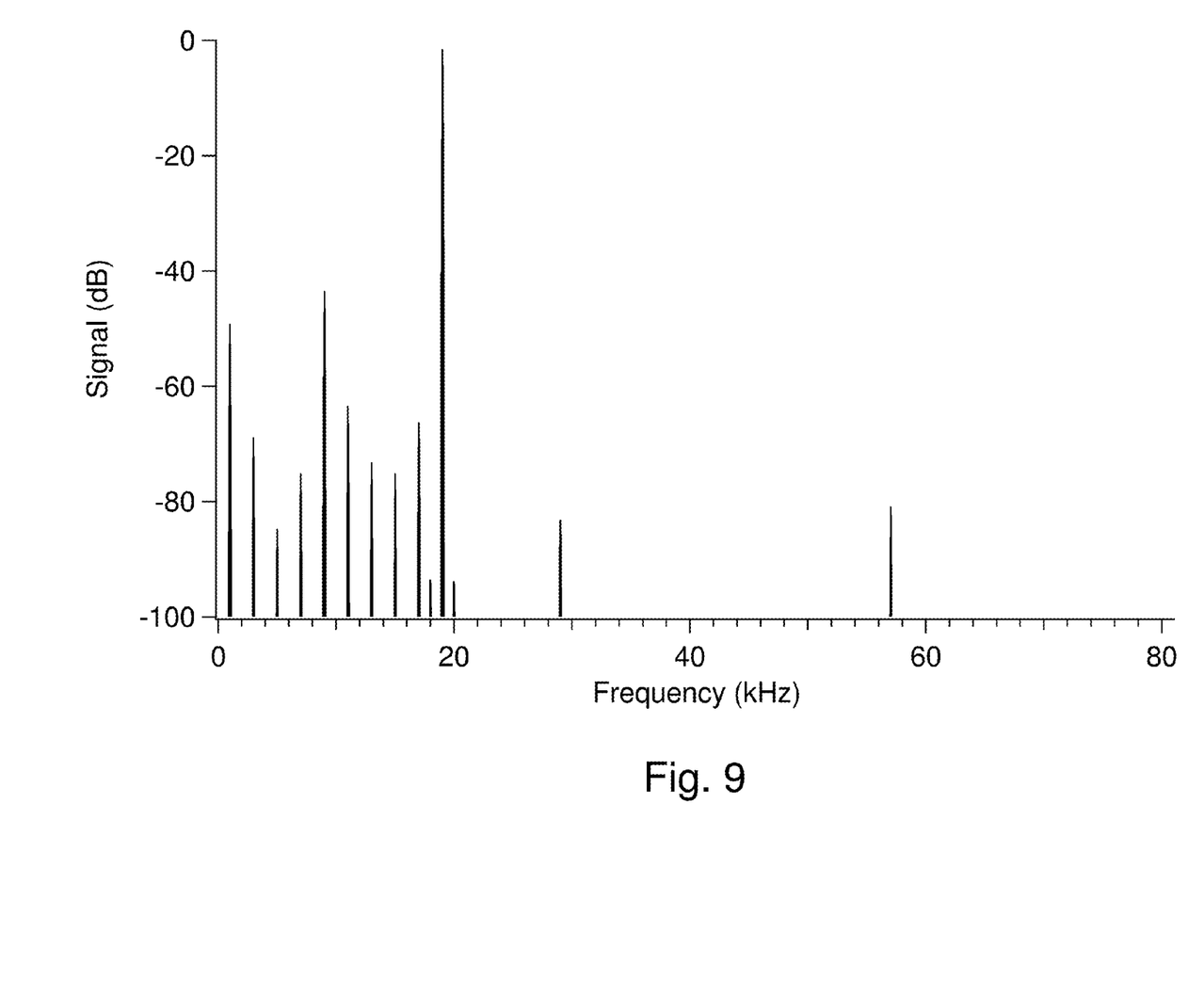
Figure 10:
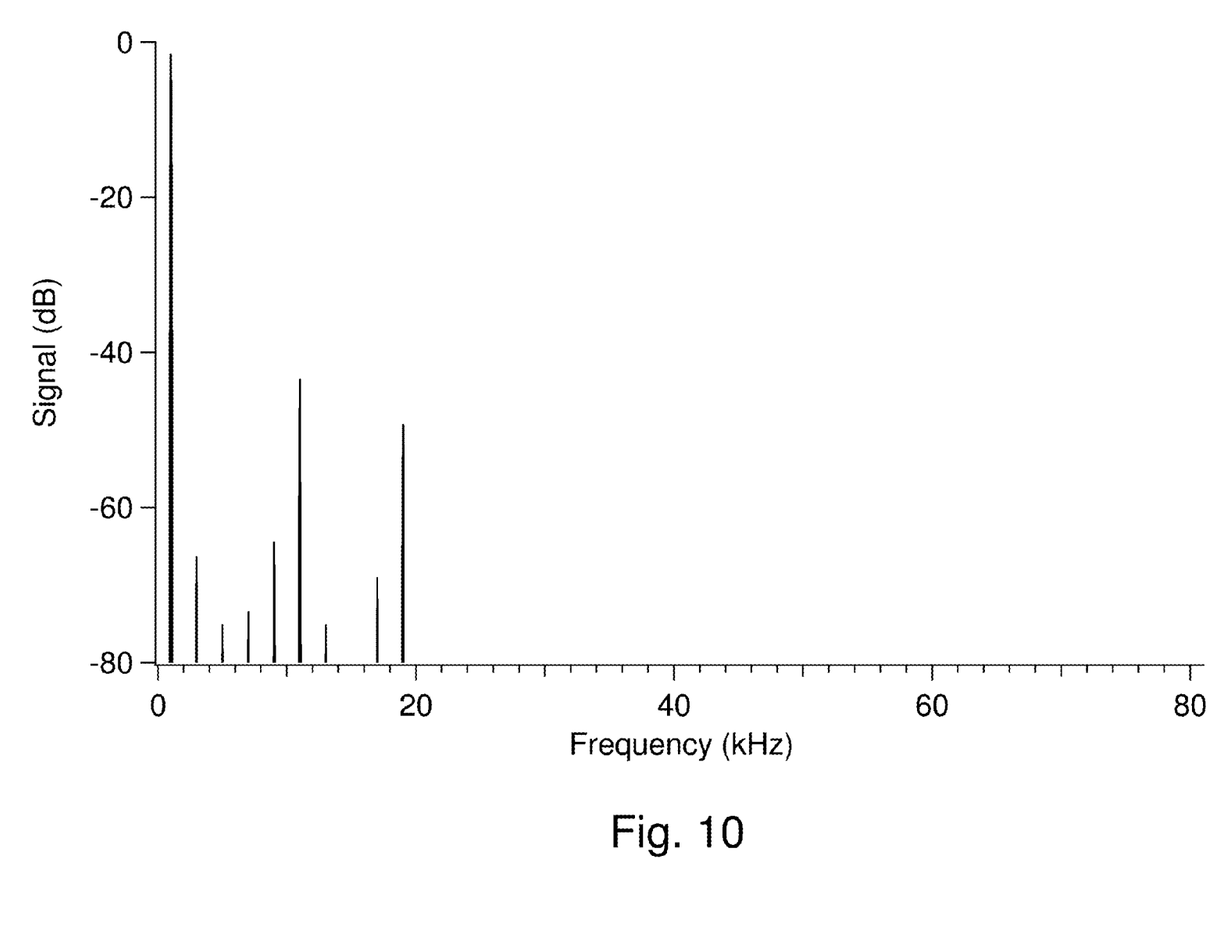

As noted above, in conventional (non ultrasonic) audio applications, the modulated, clipped signal is demodulated back down to audio baseband. For baseband processing, one way to use the techniques disclosed herein is to modulate into the lower sideband (instead of upper sideband as described in the examples above) at 20 kHz and use a high sampling rate. In this case, modulation products that are above the modulation frequency are distortion and can be filtered away. A high sampling rate is used in various embodiments because as distortion product frequencies approach the Nyquist frequency they begin to alias back down the spectrum. Using a high sampling rate allows for a large frequency headroom before aliasing begins and the distortion magnitude should be sufficiently diminished before it approaches the pass-band (below the modulation frequency). FIGS. 8-10 show an example sequence of modulation, filtering, and demodulation, along with the resulting spectrum. More particularly, FIG. 8 shows an example of a modulated spectrum lower sideband assuming a 20 kHz modulation frequency and assuming the baseband audio signal is a 1 kHz tone.

FIG. 9 shows the modulated, filtered spectrum, with the frequency bins primarily falling below 20 kHZ. FIG. 10 illustrates the demodulated filtered signal, removing the frequencies above 20 kHZ. This demodulated, corrected signal can be compared with the spectrum of the clipped tone in FIG. 2. In this example the total harmonic distortion is reduced from 36% to 1.5%.

Embodiments disclosed herein can be performed on a processor, such as a digital signal processor or other processor. A processor may be implemented utilizing any form of hardware, software, or a combination thereof. A processor may include, for example, one or more processors, cores, controllers, central processing units, ASICs, PLAs, PALs, PLDs, CPLDs, FPGAs, logical components, or other mechanism or device that manipulates or operates on signals, whether analog or digital, based on hard coding, configuration or wiring of the circuitry, the execution of operational instructions, or a combination thereof.

The processor may further include, memory (separate, integrated or embedded from the one or more processors), which may be include one or more memory devices. Such a memory device may include, for example, one or a combination of memory types such as read-only memory, random access memory, volatile and non-volatile memory, static memory, dynamic memory, flash memory, cache memory, or other information storage device, whether magnetic, acoustic, optical or otherwise.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An audio system for mitigating distortion caused by clipping, comprising:
   a processor configured to:
      receive a baseband audio signal and modulate the baseband audio signal to create a modulated audio signal comprising audio signal frequency components in a first frequency range;
      clip the modulated audio signal to create a clipped, modulated audio signal the clipped modulated audio signal comprising the audio signal frequency components in the first range and further comprising distortion frequency components outside the first frequency range; and
      filter the clipped, modulated audio signal to remove frequency components outside the first frequency range and create a filtered, clipped, modulated audio signal;
   a digital-to-analog converter comprising an input coupled to receive the filtered, clipped, modulated audio signal from the processor and configured to create an analog audio signal;
   an amplifier having an input coupled to receive the analog audio signal and configured to generate an amplified analog audio signal; and
   an ultrasonic audio modulator coupled between the processor and the audio amplifier.

2. The audio system of claim 1, wherein the processor is further configured to add an ultrasonic carrier signal to the clipped, modulated audio signal.

3. The audio system of claim 2, wherein the processor is further configured to add the ultrasonic carrier signal to the clipped, modulated audio signal before the filtering.

4. The audio system of claim 2, wherein the processor is further configured to add the ultrasonic carrier signal to the clipped, modulated audio signal after the filtering.

5. The audio system of claim 2, further comprising an ultrasonic emitter coupled to the amplifier, wherein the amplified analog audio signal comprises an amplified ultrasonic audio signal and the ultrasonic emitter is configured to launch an ultrasonic pressure wave representing the amplified ultrasonic audio signal.

6. The audio system of claim 1, wherein the processor is further configured to demodulate the filtered, clipped, modulated audio signal to create a baseband clipped audio signal.

7. The audio system of claim 6, further comprising an audio speaker coupled to the amplifier, wherein the amplified analog audio signal comprises an amplified baseband audio signal.

8. The audio system of claim 1, wherein modulation of the baseband audio signal comprises single sideband modulation and wherein the first frequency range is an upper sideband or lower sideband of the modulated audio signal.

9. An audio system for mitigating distortion caused by clipping, comprising:
   a processor configured to:
      receive a baseband audio signal and modulate the baseband audio signal to create a modulated audio signal comprising audio signal frequency components in a first frequency range, wherein modulation of the baseband audio signal comprises single-sideband modulation using a Hilbert transform and wherein the first frequency range is the upper sideband of the transformed audio signal;
      clip the modulated audio signal to create a clipped, modulated audio signal the clipped modulated audio signal comprising the audio signal frequency components in the first range and further comprising distortion frequency components outside the first frequency range; and
      filter the clipped, modulated audio signal to remove frequency components outside the first frequency range and create a filtered, clipped, modulated audio signal by applying a high pass filter to the clipped, modulated audio signal to remove frequency components below the single-sideband modulation frequency;
   a digital-to-analog converter comprising an input coupled to receive the filtered, clipped, modulated audio signal from the processor and configured to create an analog audio signal; and
   an amplifier having an input coupled to receive the analog audio signal and configured to generate an amplified analog audio signal.

10. A method for mitigating distortion of an audio signal, comprising:
   receiving a baseband audio signal and modulating the baseband audio signal to create a modulated audio signal comprising audio signal frequency components in a first frequency range;
   clipping the modulated audio signal to create a clipped, modulated audio signal the clipped modulated audio signal comprising the audio signal frequency components in the first range and further comprising distortion frequency components outside the first frequency range;

filtering the clipped, modulated audio signal to remove frequency components outside the first frequency range and create a filtered, clipped, modulated audio signal; and adding an ultrasonic carrier to the clipped, modulated audio signal or the filtered, clipped, modulated audio signal to create an ultrasonic audio signal.

11. The method of claim 10, wherein the ultrasonic carrier is added after the step of filtering.

12. The method of claim 10, wherein the ultrasonic carrier is added before the step of filtering.

13. The method of claim 10, further comprising converting the ultrasonic audio signal to an analog ultrasonic audio signal.

14. The method of claim 13, further comprising amplifying the analog ultrasonic audio signal and providing the amplified analog ultrasonic audio signal to an ultrasonic emitter.

15. The method of claim 10, further comprising further demodulating the filtered, clipped, modulated audio signal to create baseband, clipped audio signal.

16. An audio system, comprising:
a processor including an input configured to:
modulate a baseband audio signal to create a modulated audio signal comprising audio signal frequency components in a first frequency range;
clip the modulated audio signal to create a clipped, modulated audio signal the clipped modulated audio signal comprising the audio signal frequency components in the first range and further comprising distortion frequency components outside the first frequency range;
add an ultrasonic carrier to the clipped modulated audio signal to create an ultrasonic audio signal; and
an amplifier having an input coupled to receive the ultrasonic audio signal and configured to generate an amplified audio signal.

17. The audio system of claim 16, wherein the processor is further configured to filter the modulated audio signal to remove frequency components outside the first frequency range and create a filtered modulated audio signal.

18. The audio system of claim 16, wherein the processor is further configured to filter the clipped modulated audio signal before the ultrasonic carrier is added.

19. The audio system of claim 16, wherein the processor is further configured to filter the clipped modulated audio signal after the ultrasonic carrier is added.

20. The audio system of claim 16, further comprising a digital-to-analog converter comprising an input coupled to receive the clipped modulated audio signal from the processor and configured to create an analog audio signal.

21. The audio system of claim 20, further comprising an analog filter having an input to receive the analog audio signal and being configured to filter the modulated audio signal to remove frequency components outside the first frequency range and create a filtered modulated audio signal.

22. The audio system of claim 21, wherein the analog filter is coupled between the digital-to-analog converter and the amplifier.

23. The audio system of claim 21, wherein the analog filter is coupled to receive the amplified audio signal.

24. The audio system of claim 16, further comprising an ultrasonic emitter configured to receive the amplified audio signal and to launch an ultrasonic pressure wave representing the amplified audio signal modulated by the ultrasonic carrier.

25. The audio system of claim 16, wherein the ultrasonic emitter has a frequency response such that the ultrasonic emitter filters frequency components outside the first frequency range.

26. The audio system of claim 16, wherein the processor is further configured to demodulate the clipped, modulated audio signal to create a baseband clipped audio signal.

27. The audio system of claim 26, wherein the processor is further configured to filter the modulated audio signal to remove frequency components outside the first frequency range and create a filtered modulated audio signal.

28. The audio system of claim 26, further comprising an audio speaker coupled to the amplifier, wherein the amplified analog audio signal comprises an amplified baseband audio signal.

29. The audio system of claim 28, further comprising an analog filter having an input to receive the analog audio signal and being configured to filter the modulated audio signal to remove frequency components outside the first frequency range and create a filtered modulated audio signal.

30. The audio system of claim 16, wherein modulation of the baseband audio signal comprises single sideband modulation and wherein the first frequency range is an upper sideband or lower sideband of the modulated audio signal.

31. The audio system of claim 16, wherein modulation of the baseband audio signal comprises a Hilbert transform and wherein the first frequency range is the upper sideband of the transformed audio signal.

* * * * *